(12) United States Patent
Kawamura

(10) Patent No.: US 7,263,452 B2
(45) Date of Patent: Aug. 28, 2007

(54) RESOLVER-TO-DIGITAL CONVERTING APPARATUS, METHOD AND PROGRAM

(75) Inventor: Takumi Kawamura, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/077,221

(22) Filed: Mar. 11, 2005

(65) Prior Publication Data
US 2005/0216218 A1 Sep. 29, 2005

(30) Foreign Application Priority Data
Mar. 12, 2004 (JP) .............................. 2004-071553

(51) Int. Cl.
G06F 19/00 (2006.01)
G01P 21/00 (2006.01)

(52) U.S. Cl. .................. 702/95; 702/106; 702/151; 33/1 N; 341/112

(58) Field of Classification Search ................ 702/66, 702/72, 79, 85, 94, 95, 106, 150, 151; 33/1 N, 33/1 PT; 318/605; 324/207.11, 207.12; 341/112, 113, 115, 116
See application file for complete search history.

(56) References Cited

U.S. PATENT DOCUMENTS

| | | | | |
|---|---|---|---|---|
| 5,925,953 | A | 7/1999 | Shibata ........................ | 310/83 |
| 6,215,426 | B1* | 4/2001 | Taniguchi et al. .......... | 341/115 |
| 6,255,794 | B1 | 7/2001 | Staebler ...................... | 318/605 |
| 6,834,244 | B2* | 12/2004 | Kim ............................ | 702/72 |
| 2003/0001564 | A1 | 1/2003 | Hayashi ................... | 324/207.12 |
| 2004/0010386 | A1* | 1/2004 | Kameya ...................... | 702/87 |

FOREIGN PATENT DOCUMENTS

| | | |
|---|---|---|
| EP | 0 412 825 | 2/1991 |
| JP | 11-118520 | 4/1999 |
| JP | 2001-82981 | 3/2001 |
| JP | 3408238 | 3/2003 |

* cited by examiner

Primary Examiner—Carol S.W. Tsai
Assistant Examiner—Manuel L. Barbee
(74) Attorney, Agent, or Firm—Young & Thompson

(57) ABSTRACT

A resolver-to-digital converting apparatus calculates a resolver rotational angle from two-phase sampling values that are the result of sampling two-phase output signals, which are obtained from a single-phase-excited, two-phase output resolver, at peak timings of a waveform. The apparatus includes a determination unit for determining whether each of the two-phase sampling values has deviated from a prescribed path of rotation by more than a predetermined amount when the two-phase sampling values are represented by orthogonal coordinates; a correction processing unit, responsive to a determination that the predetermined amount has been exceeded, for applying a correction to the two-phase sampling values using an equation of a tangent to the path of rotation at a point on the path of rotation at which the previous resolver rotational angle was obtained; and an angle calculation unit for obtaining a resolver rotational angle at the corrected two-phase sampling values obtained by correction processing.

5 Claims, 19 Drawing Sheets

FIG. 7

| QUADRANT | 1 | | 2 | | 3 | | 4 | |
|---|---|---|---|---|---|---|---|---|
| ANGLE | 0~45 | 45~90 | 90~135 | 135~180 | 180~225 | 225~270 | 270~315 | 315~360 |
| SINE OUTPUT | POSITIVE | | POSITIVE | | NEGATIVE | | NEGATIVE | |
| COSINE OUTPUT | POSITIVE | | NEGATIVE | | NEGATIVE | | POSITIVE | |
| SIZE RELATIONSHIP BETWEEN $|\sin\theta|$ AND $|\cos\theta|$ | $|\sin\theta| < |\cos\theta|$ | $|\sin\theta| > |\cos\theta|$ | $|\sin\theta| > |\cos\theta|$ | $|\sin\theta| < |\cos\theta|$ | $|\sin\theta| < |\cos\theta|$ | $|\sin\theta| > |\cos\theta|$ | $|\sin\theta| > |\cos\theta|$ | $|\sin\theta| < |\cos\theta|$ |

ALLOWABLE RANGE

RESOLVER-TO-DIGITAL CONVERTING APPARATUS, METHOD AND PROGRAM

FIELD OF THE INVENTION

This invention relates to a resolver-to-digital converting apparatus, method and program.

BACKGROUND OF THE INVENTION

Resolvers are used widely as devices for detecting the rotational angle of rotary shafts employed in industrial equipment such as vehicles. Since resolvers are capable of operating even in operating environments where the temperature is in the vicinity of 150° C., they are particularly ideal as rotational angle detectors in the field of motor control.

A resolver is one type of transformer. When a winding on the input side is excited by an AC voltage, an AC output voltage is induced in a winding on the output side. The relationship between rotational angle and the input and output of a resolver is shown in FIG. 13. The waveforms synchronized to an excitation power supply are the actual outputs (sine output and cosine output) at the rotational angles of a rotor. It will be understood that if sampling is performed at the peaks of the waveform of the excitation power supply and each of the output values at the rotational angle are connected, the waveforms will take on the cosine and sine values of the rotational angles. The absolute rotational angle of the rotor can be determined from these cosine and sine values.

In an actual system, however, it is highly likely that the output of a resolver will contain external noise in view of the fact that the resolver is mounted on the shaft of a rotor of a motor or the like. If the output contains noise, error ascribable to noise will occur when the resolver output signal is subjected to an analog-to-digital conversion. The A/D converter itself exhibits conversion error as well. This makes it necessary to correct for error based upon the result of the A/D conversion.

An R/D converter serves as a device that digitizes and extracts a rotational angle from a resolver. However, since an R/D converter has a high unit cost and involves a greater amount of hardware, a rotational angle conversion method that does not rely upon an R/D converter has been sought.

Rotational angle in a resolver is found by applying an analog-to-digital conversion to the sine and cosine output signals of the resolver and to the excitation power supply and processing the results of this A/D conversion. This is achieved using an apparatus comprising a single-phase excited, two-phase output resolver, A/D converters on two or more channels and a microcomputer.

FIG. 14 illustrates a method described in the specification of Patent Document 1. The excitation power supply signal, sine output signal and cosine output signal of a resolver are sampled by an A/D converter (step S41), and the sine and cosine output signals are each subjected to a Fourier transform (steps S42, S43). Next, $|\text{Sin } \theta|$, $|\text{Cos } \theta|$ are calculated from the product of a Fourier series (steps S44, S45) and the quadrant is discriminated (step S46). Next, $|\text{Sin } \theta|/|\text{Cos } \theta|$ is calculated (step S47) and a digital rotational angle is found from the quadrant and a table of an arc tan ($\tan^{-1}$) function (step S48). At steps S42 to S45, $|\text{Sin } \theta|$, $|\text{Cos } \theta|$ are obtained by Equations (1) to (6) below using results of A/D conversion applied to n-number of excitation power supply sampling values, n-number of sine output sampling values and n-number of cosine output sampling values at sampling points of the kind illustrated in FIG. 15.

$$SA1 = \sum_{k=1}^{n} (\text{sine output sampling} \quad (1)$$

value × excitation power supply sampling value)

$$SB1 = \sum_{k=1}^{n} (\text{sine output sampling value} \times \text{value shifted} \quad (2)$$

by 90° from excitation power supply sampling value)

$$|\sin \theta| = \sqrt{(SA1)^2 + (SB1)^2} \quad (3)$$

$$CA2 = \sum_{k=1}^{n} (\text{cosine output sampling} \quad (4)$$

value × excitation power supply sampling value)

$$CB2 = \sum_{k=1}^{n} (\text{cosine output sampling value} \times \text{value shifted} \quad (5)$$

by 90° from excitation power supply sampling value)

$$|\cos \theta| = \sqrt{(CA2)^2 + (CB2)^2} \quad (6)$$

According to a method described in Patent Document 2, a DC-component error possessed by an A/D converter is eliminated by performing sampling twice in one period of an excitation power supply and subtracting the two results of A/D conversions, as illustrated in FIG. 16. An integral is subsequently calculated from the results of A/D conversion and the digital angle is obtained.

According to a method described in the specification of Patent Document 3 and shown in FIG. 17, sampling is performed twice in succession at points bracketing the peaks of sine and cosine output signals of a resolver, values that do not fall within an allowable range are excluded and noise produced at the first or second sampling time is eliminated.

Furthermore, with a method that employs the method of least squares that is generally well known, a regression line is found from multiple items of sampled data, as shown in FIG. 18, results of an A/D conversion applied to sine and cosine output signals are substituted into the equation of the regression line and an error correction is performed. This method will be described with reference to the flowchart of FIG. 19. A sine output signal and a cosine output signal are sampled by an A/D converter (step S51) and data obtained as a result of the conversion is stored in memory (step S52). The equation of a regression line is calculated from data that has already been stored in the memory (step S53) and the latest result of conversion is substituted into the equation of this regression line (step S54). Correction values of $|\text{Sin } \theta|$, $|\text{Cos } \theta|$ are calculated from the result of substitution (step S55). Further, the coordinates of the center of $|\text{Sin } \theta|$, $|\text{Cos } \theta|$ are calculated (step S56). In which quadrant the found point belongs is discriminated (step S57), $|\text{Sin } \theta|/|\text{Cos } \theta|$ is found (step S58) and the angle, namely the digital rotational angle, is calculated from the quadrant and the function Tan$^{-1}$ (step S59).

[Patent Document 1]
JP Patent Kokai Publication No.11-118520A

[Patent Document 2]
JP Patent No.3408238

[Patent Document 3]
JP Patent Kokai Publication No. P2001-82981A

SUMMARY OF THE DISCLOSURE

Problems that arise with the prior art fall roughly into three categories. The first is that there is a limitation upon the number of samplings in A/D conversion, the second is that a large number of CPU operations are performed by the microcomputer, and the third is that external noise and conversion error possessed by the A/D converter cannot be corrected for completely.

With the method described in Patent Document 1, it is necessary that the sampling frequency of the A/D conversion be set to one-half the excitation power supply frequency or greater in order to apply the Fourier transform. An A/D conversion having a high speed in proportion to the frequency of the excitation power supply is required. Further, since the excitation power supply signal also is sampled, the number of inputs to the A/D converter increases. Furthermore, when |Sin θ|, |Cos θ| are obtained, calculation of a square root becomes necessary with respect to the results of the A/D conversion. This increases the load upon the CPU of the microcomputer.

On the other hand, with the apparatus described in Patent Documents 2 and 3, the number of samplings in the A/D conversion is small, namely twice per period of the excitation power supply, and the amount of CPU calculation in the microcomputer is kept small as well. However, if an error develops between the two results of A/D conversions, as is the case where the ground level of the excitation power supply fluctuates for some externally imposed reason, the error cannot be eliminated.

With error correction based upon the method of least squares, increasing the number of samplings of the A/D conversion is the only way to improve the precision of digital angles, and hence the amount of calculation for obtaining the equation of a regression line increases in proportion to the number of samplings. If the rotor rotates at high speed, the proportion of time required for operations by the microcomputer in the control period increases. Thus, there is much to be desired in the art.

Accordingly, an object of the present invention is to provide a resolver-to-digital converting apparatus, method and program whereby the number of samplings in an A/D conversion can be reduced and the amount of calculation diminished, and whereby a correction is made for external noise and for various conversion errors that occur in an A/D converter.

The principle of the present invention will now be described.

The outputs (sine and cosine outputs) of a single-phase excited, two-phase output resolver are sampled by an A/D converter at the timings of the peaks of a waveform synchronized to an excitation power supply, as illustrated in FIG. 1. When the rotor of the resolver is rotated through one revolution, a point O representing the sampled two-phase output follows a path of rotation indicated by a circle S as shown in FIG. 2. In actuality, however, there are instances where the result of the conversion by the A/D converter deviates from the expected path owing to external factors such as quantization error, conversion error in the A/D converter and noise in the excitation power supply. The present invention is characterized in that this problem is solved by correcting for error using an equation of the tangent T to the circle S and calculating a digital angle θ.

According to a first aspect of the present invention, there is provided a resolver-to-digital converting apparatus for calculating a resolver rotational angle from values (referred to as "two-phase sampling values") that are the result of sampling two-phase output signals, which are obtained from a single-phase excited, two-phase output resolver, at peak timings of a waveform. This converter comprises a determination unit for determining whether each of the two-phase sampling values has deviated from a prescribed path of rotation by more than a predetermined amount when the two-phase sampling values are represented by orthogonal coordinates; a correction processing unit, responsive to a determination by the determination unit that the predetermined amount has been exceeded, for applying a correction to the two-phase sampling values using an equation of a tangent to the path of rotation at a point on the path of rotation at which the previous resolver rotational angle was obtained; and an angle calculation unit for obtaining a resolver rotational angle at the corrected two-phase sampling values obtained by the correction processing unit.

According to a second aspect of the present invention, there is provided a resolver-to-digital conversion method for calculating a resolver rotational angle from values (referred to as "two-phase sampling values") that are the result of sampling two-phase output signals, which are obtained from a single-phase excited, two-phase output resolver, at peak timings of a waveform. The method comprises the steps of: determining whether each of the two-phase sampling values has deviated from a prescribed path of rotation by more than a predetermined amount when the two-phase sampling values are represented by orthogonal coordinates; in response to a determination that the predetermined amount has been exceeded, applying a correction to the two-phase sampling values using an equation of a tangent to the path of rotation at a point on the path of rotation at which the previous resolver rotational angle was obtained; and obtaining a resolver rotational angle at the corrected two-phase sampling values obtained by correction processing.

According to a third aspect of the present invention, there is provided a resolver-to-digital conversion method for calculating a resolver rotational angle from values (referred to as "two-phase sampling values") that are the result of sampling two-phase output signals, which are obtained from a single-phase excited, two-phase output resolver, at peak timings of a waveform. The method comprises the steps of: obtaining average values of the two-phase sampling values in the past; determining whether differences between the latest two-phase sampling values (referred to as "present values" below) and previous two-phase sampling values exceed predetermined tolerance values; if a determination is made that a tolerance value has been exceeded, obtaining a first distance between the present value and the previous value and a second distance between the average value and the previous value; adopting the present value as a correction candidate value if the first distance is less than the second distance, and adopting the average value as the correction candidate value if the first distance is equal to or greater than the second distance. The method further comprises the steps of: when the previous value is represented by orthogonal coordinates, obtaining a correction value by substituting the correction candidate value into an equation of a tangent that passes through the previous value on a circle that passes through the previous value; adopting the correction candidate value as the correction value if the distance between the correction value and the previous value is greater than the distance between the correction candidate value and the previous value; obtaining a first slope at the average value; obtaining a second slope at the present value; obtaining a third slope at the correction value; and obtaining a resolver rotational angle from a slope, from among the first, second and third slopes, that is closest to a slope at the previous value.

According to a fourth aspect of the present invention, there is provided a program for causing a computer, which constitutes a resolver-to-digital converting apparatus for calculating a resolver rotational angle from values (referred to as "two-phase sampling values") that are the result of sampling two-phase output signals, which are obtained from a single-phase excited, two-phase output resolver, at peak timings of a waveform, to execute the following processing: processing for determining whether each of the two-phase sampling values has deviated from a prescribed path of rotation by more than a predetermined amount when the two-phase sampling values are represented by orthogonal coordinates; in response to a determination that the predetermined amount has been exceeded, processing for applying a correction to the two-phase sampling values using an equation of a tangent to the path of rotation at a point on the path of rotation at which the previous resolver rotational angle was obtained; and processing for obtaining a resolver rotational angle at the corrected two-phase sampling values obtained by correction processing.

According to a fifth aspect of the present invention, there is provided a program for causing a computer, which constitutes a resolver-to-digital converting apparatus for calculating a resolver rotational angle from values (referred to as "two-phase sampling values") that are the result of sampling two-phase output signals, which are obtained from a single-phase excited, two-phase output resolver, at peak timings of a waveform, to execute the following processing steps: step of obtaining average values of the two-phase sampling values in the past; step of determining whether differences between the latest two-phase sampling values (referred to as "present values" below) and previous two-phase sampling values exceed predetermined tolerance values; step of, if a determination is made that a tolerance value has been exceeded, obtaining a first distance between the present value and the previous value and a second distance between the average value and the previous value; step of adopting the present value as a correction candidate value if the first distance is less than the second distance, and adopting the average value as the correction candidate value if the first distance is equal to or greater than the second distance. The program further comprises the steps: step of, when the previous value is represented by orthogonal coordinates, obtaining a correction value by substituting the correction candidate value into an equation of a tangent that passes through the previous value on a circle that passes through the previous value; step of adopting the correction candidate value as the correction value if the distance between the correction value and the previous value is greater than the distance between the correction candidate value and the previous value; step of obtaining a first slope at the average value; step of obtaining a second slope at the present value; step of obtaining a third slope at the correction value; and step of obtaining a resolver rotational angle from a slope, from among the first, second and third slopes, that is closest to a slope at the previous value.

The present invention preferably is so adapted that if values that are the result of sampling the two-phase output signals at the timings of nodes of the waveform deviate from the center of the circle by more than a predetermined amount, then the values that are the result of sampling at the peak timings are corrected by the amount of the deviation.

The meritorious effects of the present invention are summarized as follows.

In accordance with the present invention, an error correction is performed using an equation of the tangent to a circle. As a result, the number of samplings of a sine output signal and cosine output signal per period of an excitation power supply diminish and so does the amount of calculation performed by a CPU in a microcomputer. That is, even if the excitation power supply attains a high frequency, temporal limitations in the A/D conversion and CPU operations are not imposed in the calculation of digital angles.

Even if external noise has been imposed upon the sampling values of the sine and cosine output signals, the effects of the noise can be suppressed because a correction is applied using the equation of a tangent at a point on the circle at which the previous resolver rotational angle was found.

Furthermore, even if the sine and cosine output signals have experienced overall fluctuation owing to fluctuation of the ground level, the sine and cosine output signals are sampled at the timing of the nodes, thereby correcting for deviation from the center of the circle and enabling the calculation of digital angles more precisely.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 7 is a table for determining in which quadrant an angle resides;

PREFERRED EMBODIMENTS OF THE INVENTION

The present invention will now be described in detail with reference to the drawings.

Figure 3:
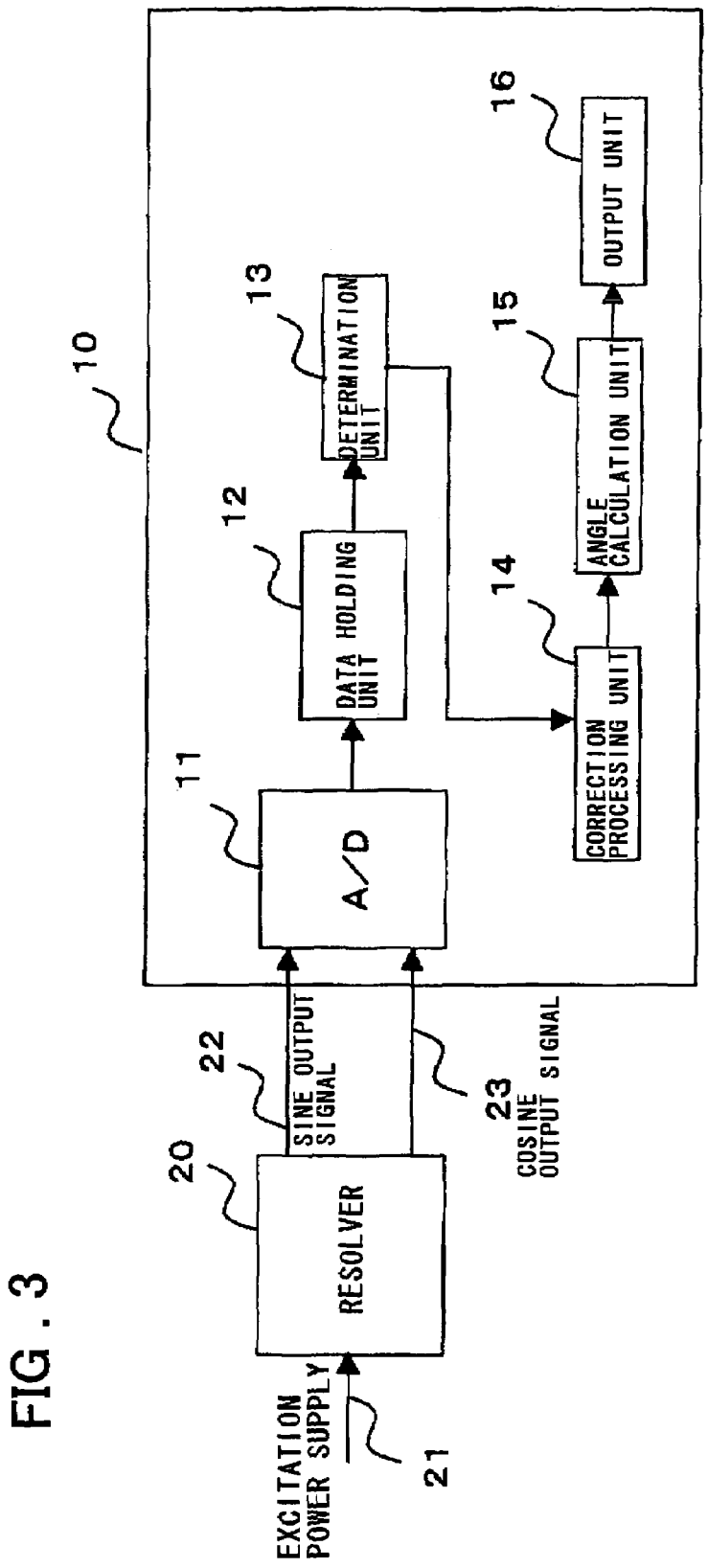
FIG. 3 is a block diagram illustrating a resolver-to-digital converting apparatus according to an embodiment of the present invention.

FIG. 3 is a block diagram illustrating a resolver-to-digital converting apparatus 10 according to an embodiment of the present invention.

As shown in FIG. 3, the resolver-to-digital converting apparatus 10 includes an A/D converter 11, a data holding unit 12, a determination unit 13, a correction processing unit 14, an angle calculation unit 15 and an output unit 16. A resolver 20, which is driven by an excitation power supply 21, outputs signals in two phases, namely a sine output signal 22 and a cosine output signal 23.

The A/D converter 11 samples and digitizes the sine output signal 22 and cosine output signal 23 at a prescribed timing, e.g., at the peaks of a waveform, and holds the digitized data in the data holding unit 12.

When one set of data corresponding to the sine output signal 22 and cosine output signal 23 being held in the data holding unit 12 is represented by orthogonal coordinates, the determination unit 13 determines whether the set of data has deviated from a prescribed path of rotation (e.g., a circular path) by more than a predetermined amount.

If the determination unit 13 indicates that the deviation has exceeded the predetermined amount, then the correction processing unit 14 applies a correction to the set of data using the equation of a tangent to the path of rotation at a point on the path of rotation at which a previous resolver rotational angle was found.

The angle calculation unit 15 finds a resolver rotational angle at the corrected set of data that is output from the correction processing unit 14. The data representing the angle found is output to the output unit 16.

It should be noted that the resolver-to-digital converting apparatus 10 may be implemented by a CPU and a program executed by the CPU.

The resolver-to-digital converting apparatus 10 constructed as set forth above involves a reduced amount of calculation because the correction formula is a predetermined equation of a tangent to a circle, namely a straight line. Further, calculation is possible if the number of samplings performed in the A/D conversion is at least one per period of the excitation power supply. Furthermore, even if the result of the A/D conversion deviates from the expected value twice, correction is possible because the base of the correction is the path of the circle that is the resolver output.

First Embodiment

An embodiment of the present invention will now be described in detail. The latest result of conversion (one set of sampling values) from the A/D converter 11 will be defined as the present value, and the previous result of conversion (one set of sampling values) from the A/D converter 11 will be defined as the previous value.

Figure 1:
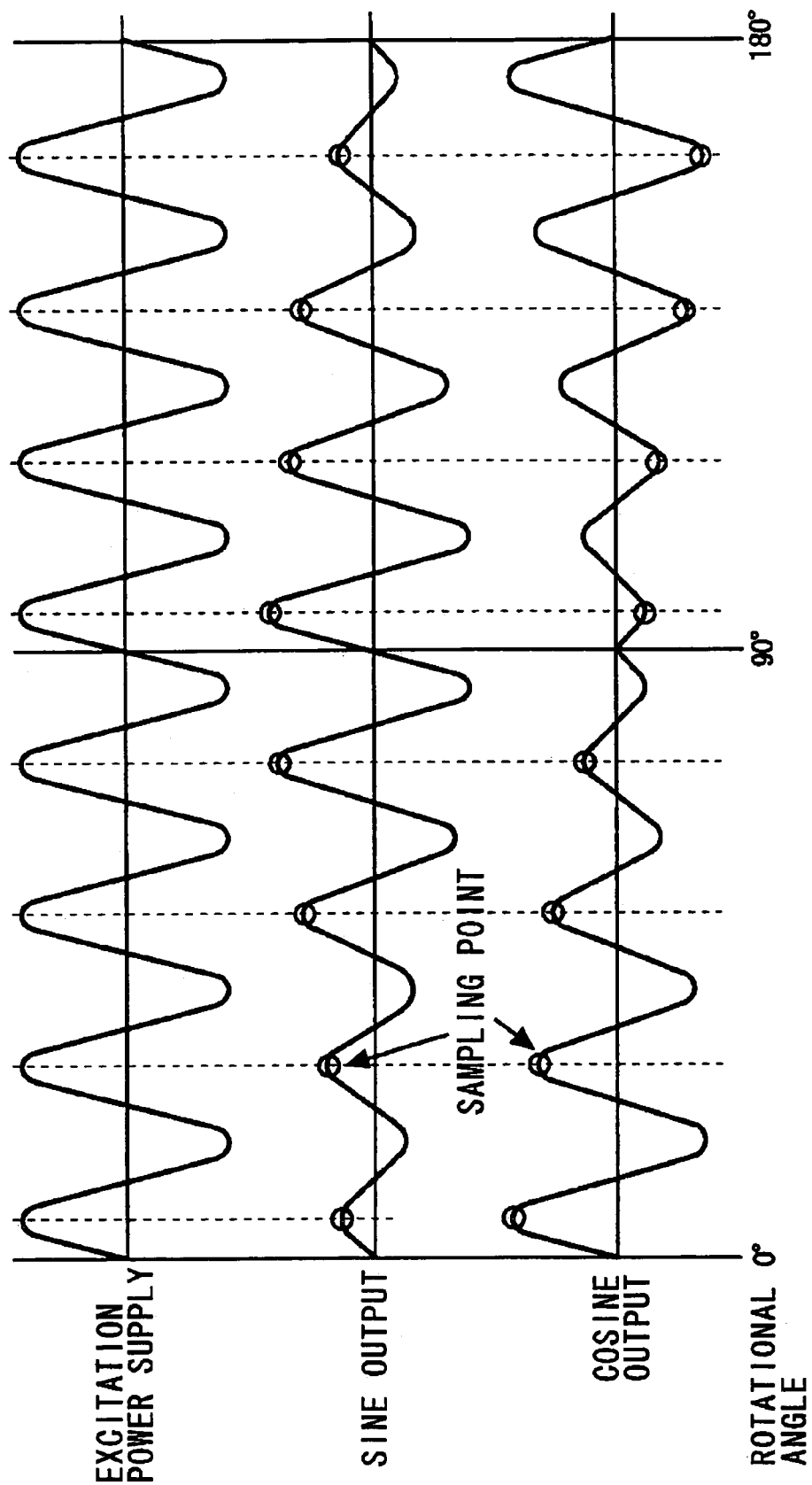
FIG. 1 is a diagram illustrating input/output waveforms of a resolver and the timing of sampling.
Figure 2:
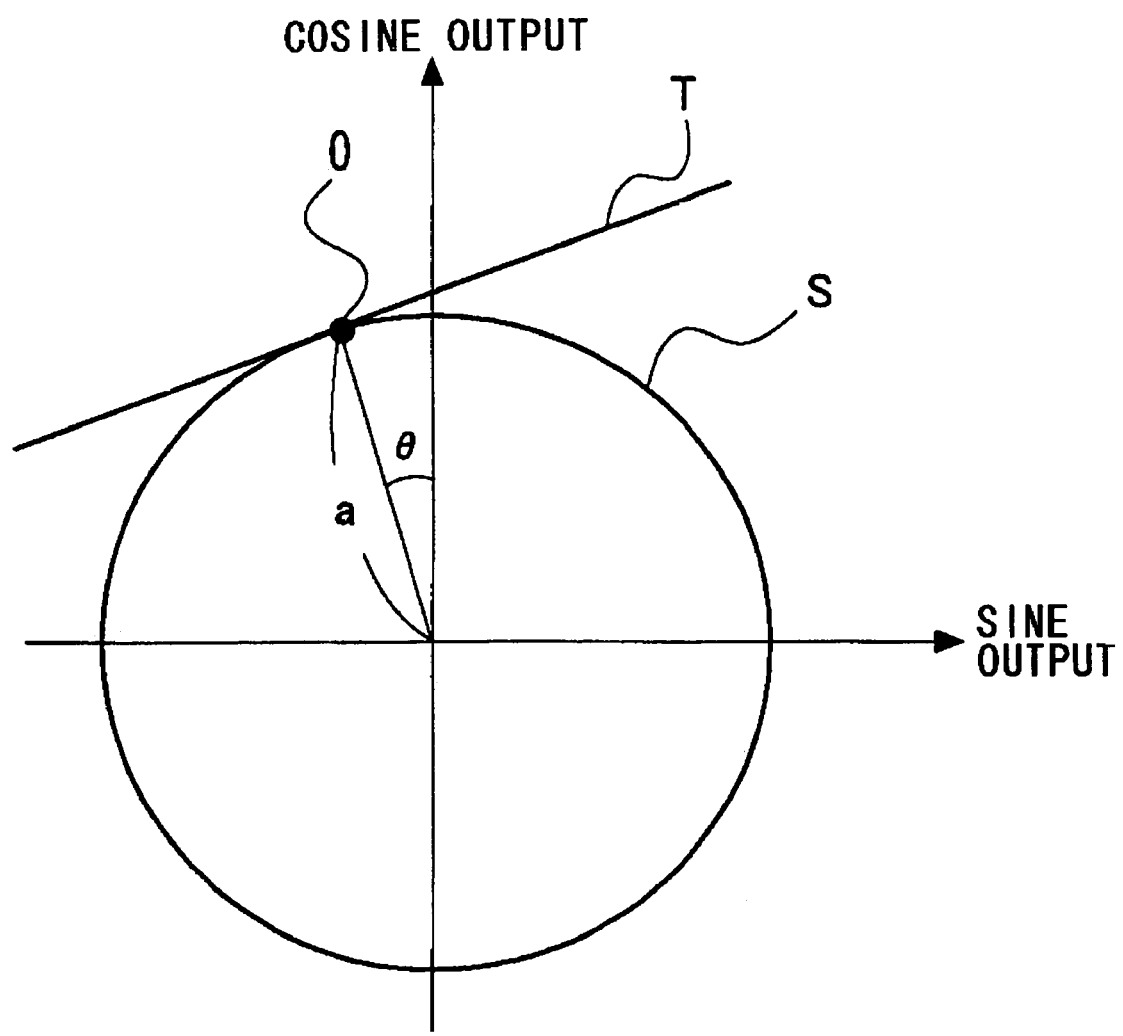
FIG. 2 is a diagram representing the principle of the present invention and illustrating a resolver sine output and cosine output expressed in an x-y plane.

When the sine output signal and cosine output signal of the resolver are sampled by the A/D converter at timings offset by one-quarter period from the timings of the nodes of the excitation power supply (the sampling timings are peaks of the waveform of the excitation power supply shown in FIG. 1) and the rotor of the resolver is rotated, the outputs of two phases that are the sine output signal and cosine output signal become a point on the path of a circle of radius a, as illustrated in FIG. 2, if there is no noise and no error in the conversion by the A/D converter. A digital angle is found by the procedure illustrated in FIGS. 4 and 5 using the path of this circle as a reference.

Figure 4:
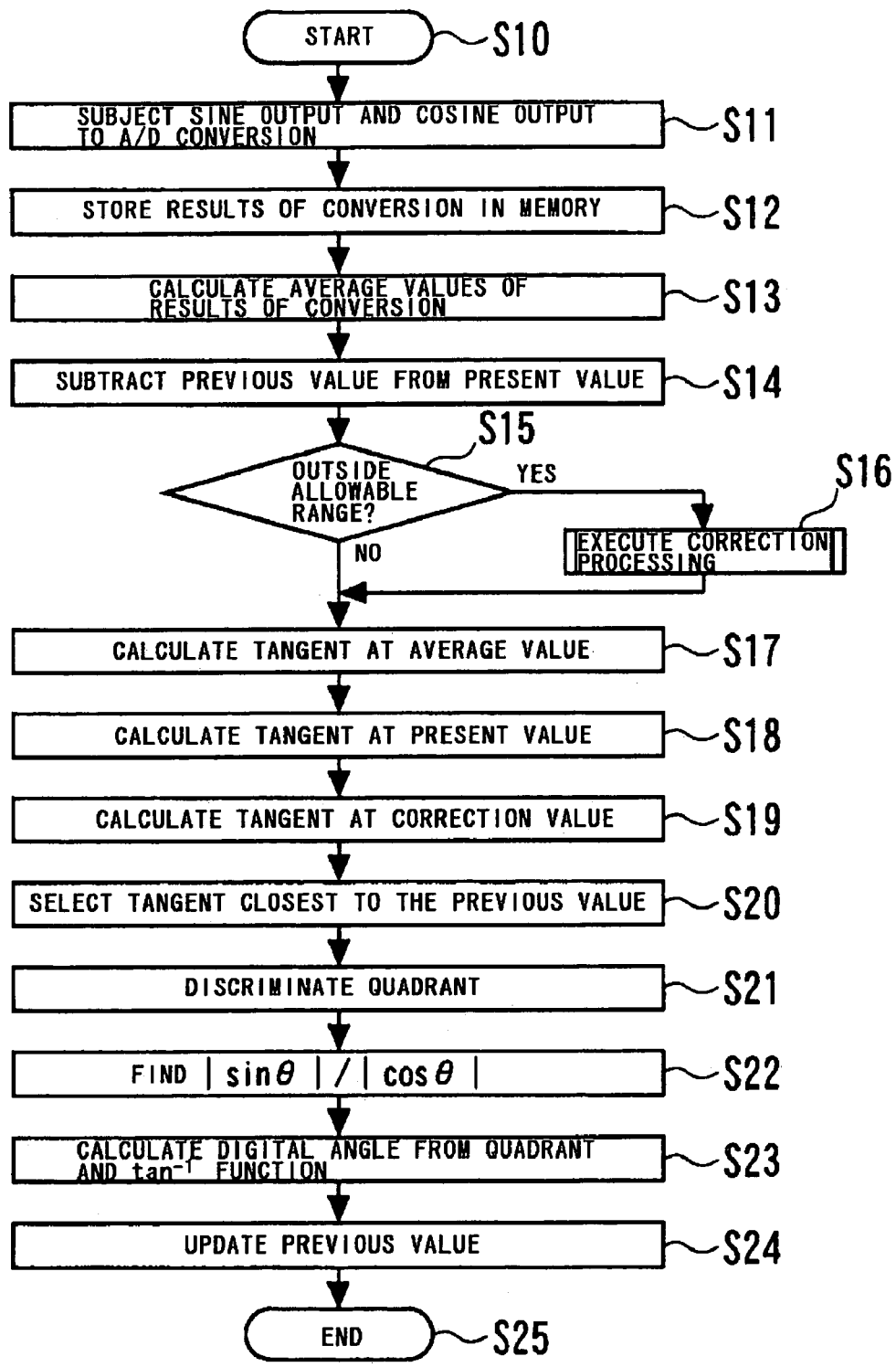
FIG. 4 is a flowchart illustrating a resolver-to-digital conversion method according to a first embodiment of the present invention.
Figure 5:
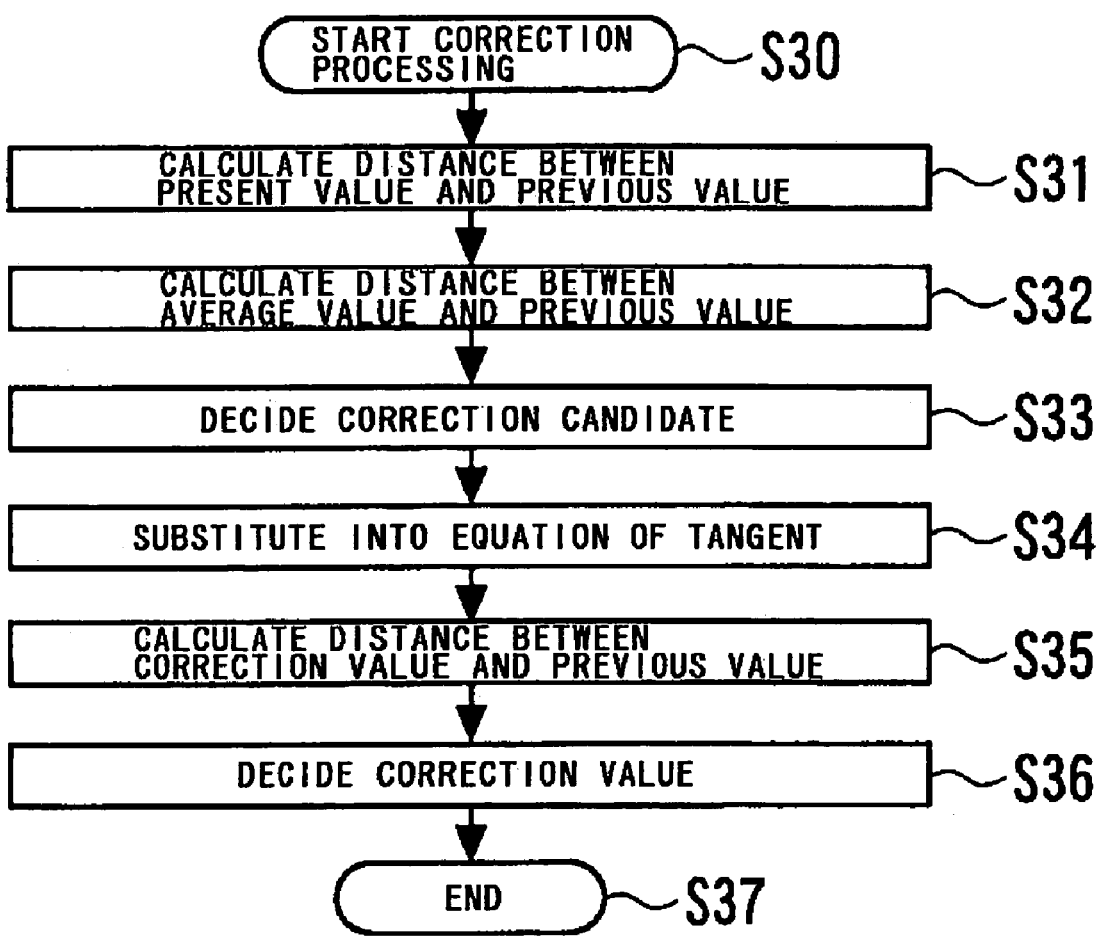
FIG. 5 is a flowchart illustrating correction processing indicated in FIG. 4.

FIG. 4 is a flowchart illustrating a resolver-to-digital conversion method according to a first embodiment of the present invention, and FIG. 5 is a flowchart illustrating correction processing indicated in FIG. 4.

The sine output and cosine output of the resolver are subjected to an A/D conversion at the peak timings (step S11) and the results of the A/D conversion of each of the signals are stored in memory (step S12).

The A/D conversion and the storing of the results of the A/D conversion are performed several times and the average values of the results of the A/D conversion are found (step S13).

The difference between the present value and the previous value is found (step S14) and whether an allowable range has been exceeded is determined (step S15).

If an allowable error has been exceeded, correction processing is executed (step S16).

In correction processing, the distance between the present value and the previous value is calculated (step S31 in FIG. 5) and the difference between the average value and the previous value is calculated (step S32). These two distances are compared and the value whose distance from the previous value is smaller is adopted as a correction-value candidate (step S33).

The values serving as the candidate for correction value determined at step S33 are substituted into an equation $xx_1 + yy_1 = a^2$ of a tangent to the circle at the previous value $(x_1, y_1)$, thereby obtaining the correction value of the present value (step S34).

The distance between the correction value and the previous value is calculated (step S35). If this distance is greater than the distance between the value of the correction-value candidate determined at step S33 and the previous value, then the value of the correction-value candidate determined at step S33 is adopted as the correction value as is (step S36), correction processing is exited and control proceeds to step S17.

Figure 6:
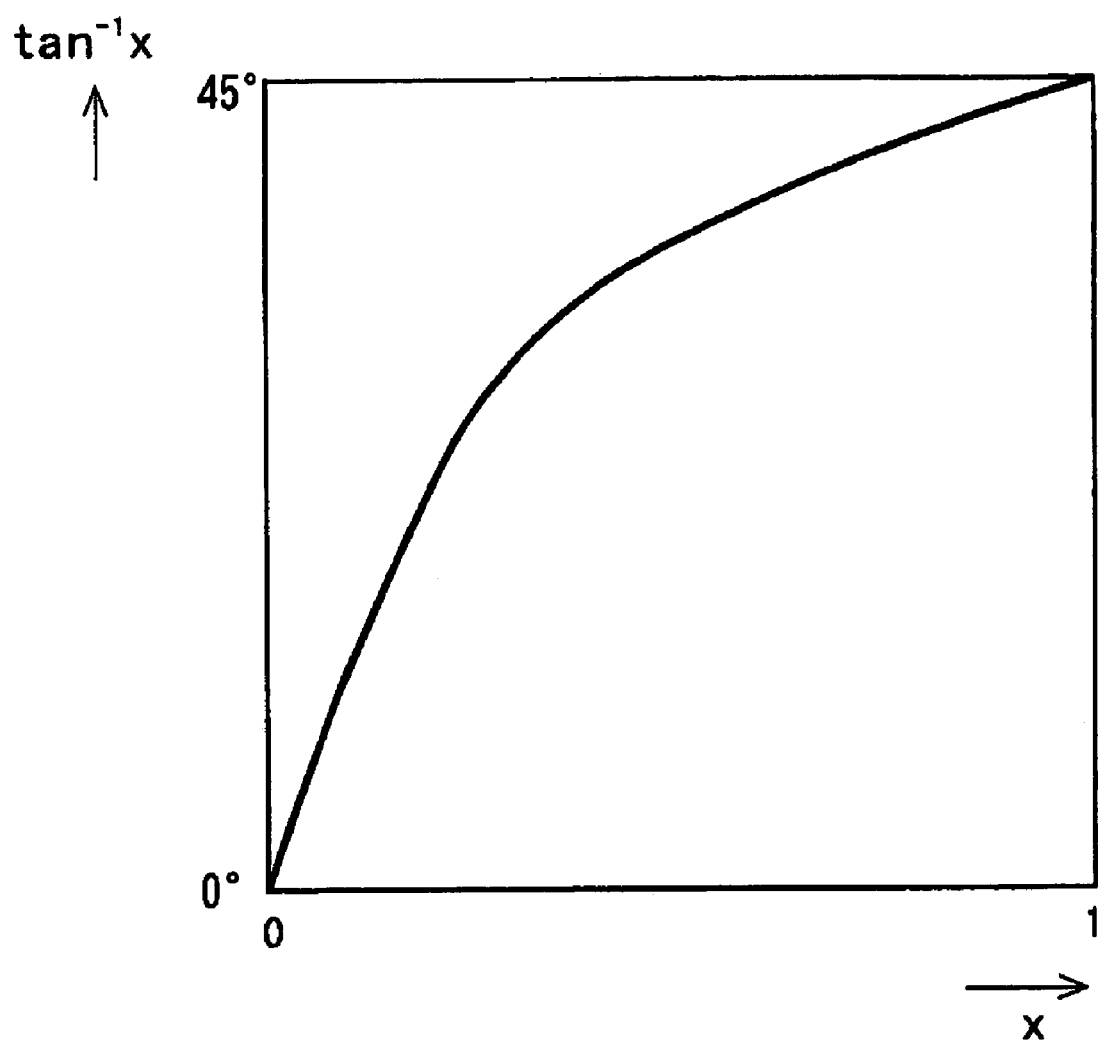
FIG. 6 is a diagram illustrating a curve representing $\text{Tan}^{-1}x$ at x.

The slope [e.g., the Tan value (tangent value) or $Tan^{-1}$ value (the arc tan value)] at the average value is found (step S17 in FIG. 4). It should be noted that the $Tan^{-1}$ function is assumed to be one in which values corresponding to a curve representing $Tan^{-1}x$ versus x of the kind shown in FIG. 6 have been stored in the form of a table.

The slope at the present value is found (step S18).

The slope at the correction value is found (step S19).

The slopes found at steps S17, S18 and S19 are compared with the slope of the previous value already stored in memory and whichever of the slopes regarding the average, present and correction values is closest to the slope of the previous value is selected (step S20).

Reference is had to a table of the kind shown in FIG. 7 and in which quadrant the angle belongs is determined from the sign of the sine output, the sign of the cosine output and the size relationship between $|\sin \theta|$ and $|\cos \theta|$ (step S21).

Next, $|\sin \theta|/|\cos 74|$ is found (step S22) and the digital rotational angle is calculated from the quadrant in which the angle belongs and the slope (step S23).

The previous value is updated (step S24). That is, the present value becomes the previous value in the next calculation.

The invention will now be described with reference to concrete examples. First, consider a case where the digital angle of a stationary rotor is found.

Figure 8:
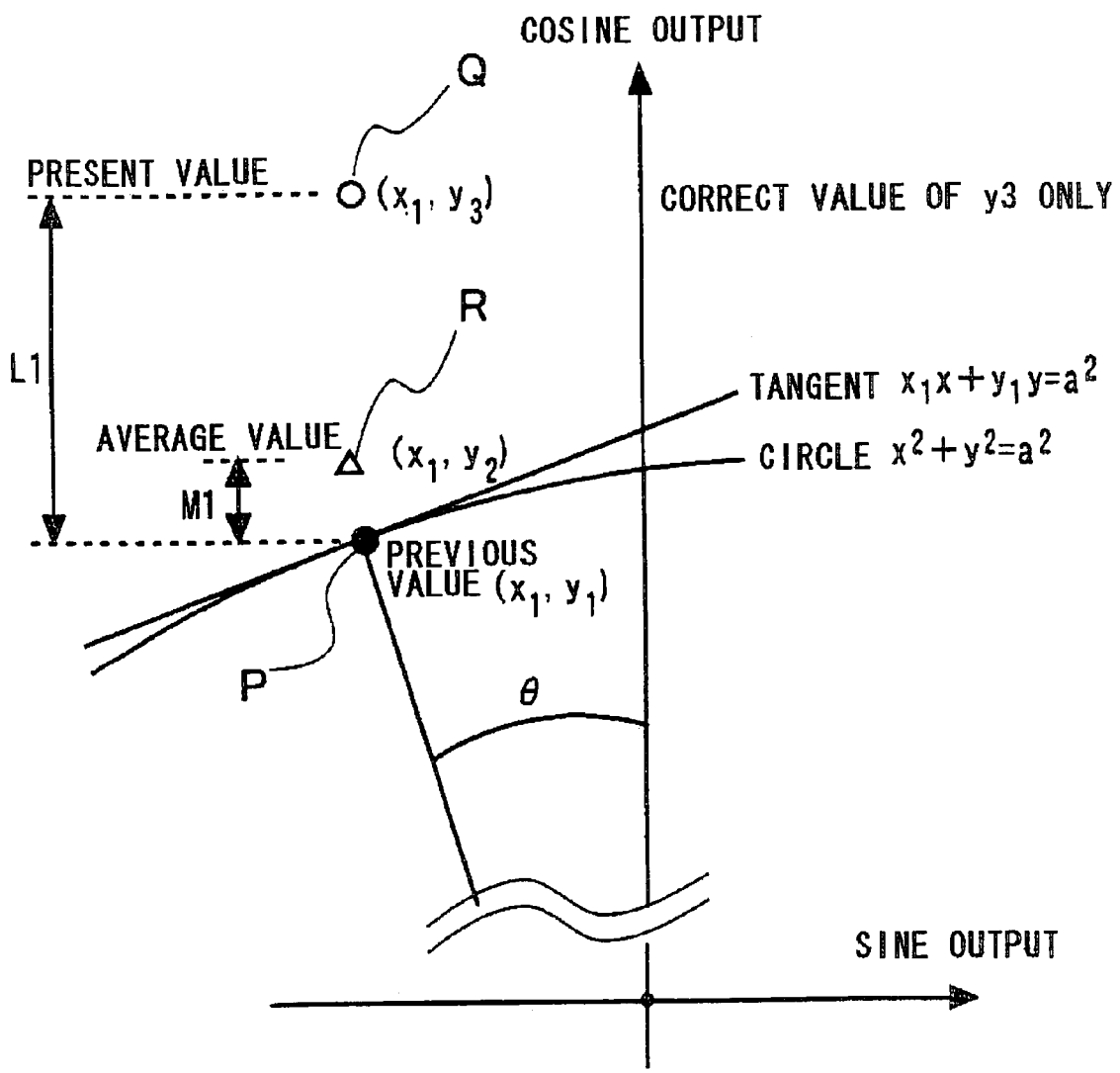
FIG. 8 is a diagram useful in describing a first specific example for obtaining a digital angle of a rotor.

In FIG. 8, let a point P indicated by the black dot represent the previous value, let a point Q indicated by the white dot represent the present value, and let a point R indicated by the triangle represent the average value, these being based upon the results of an A/D conversion obtained by sampling performed a plurality of times. Here it is assumed that the present value along the direction of the cosine output axis exceeds the previous value by more than an allowable range.

Since a correction is required along the direction of the cosine output axis in this case, the correction candidate is represented by the coordinates $(x_1, y_2)$ of the average value in view of the fact that L1>M1 holds. If $x_1$ is substituted into the equation of the tangent and $y_2$ is corrected, $y_1$ is the result. The corrected coordinates become $(x_1, y_1)$. This is a value that is the same as the previous value.

The digital angle of the stationary rotor can be found from the relationship between the table of the $\tan^{-1}$ function and the quadrant, as described earlier.

Next, consider another case where the digital angle of a stationary rotor is found. In this case, however, the present value exceeds the previous value by more than the allowable range not only along the direction of the cosine output axis but also along the direction of the sine output axis.

Figure 9:
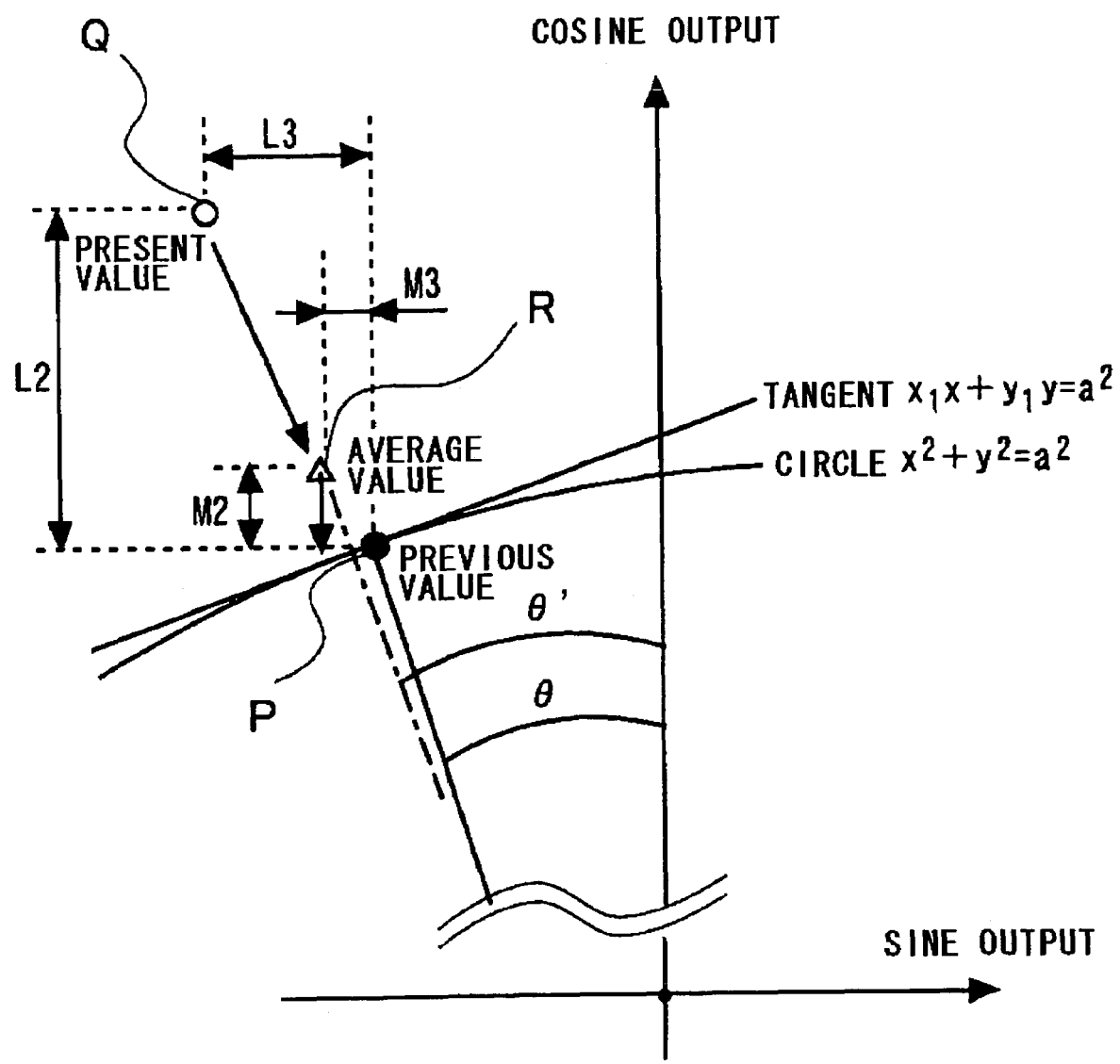
FIG. 9 is a diagram useful in describing a second specific example for obtaining a digital angle of a rotor.

In FIG. 9, let a point P indicated by the black dot represent the previous value, let a point Q indicated by the white dot represent the present value, and let a point R indicated by the triangle represent the average value, these being based upon the results of an A/D conversion obtained by sampling performed a plurality of times. Here it is assumed that the present value along the direction of the sine output axis and the present value along the direction of the cosine output axis exceed the previous values by more than an allowable range.

Since a correction is required along the directions of both the sine output axis and cosine output axis in this case, the correction candidates become the coordinates of the average values in view of the fact that L2>M2, L3>M3 holds.

As a result of the correction, along the direction of the cosine output axis the average value becomes the correction value, and along the direction of the sine output axis the average value becomes the correction value. Accordingly, if the tangent value at the average value, the tangent value at the present value and the tangent value at the correction value are calculated, the tangent value at the average value becomes that closest to the previous value and the digital angle $\theta'$ of the rotor can be found from this tangent value.

Next, consider a case where the rotor rotates.

Figure 10:
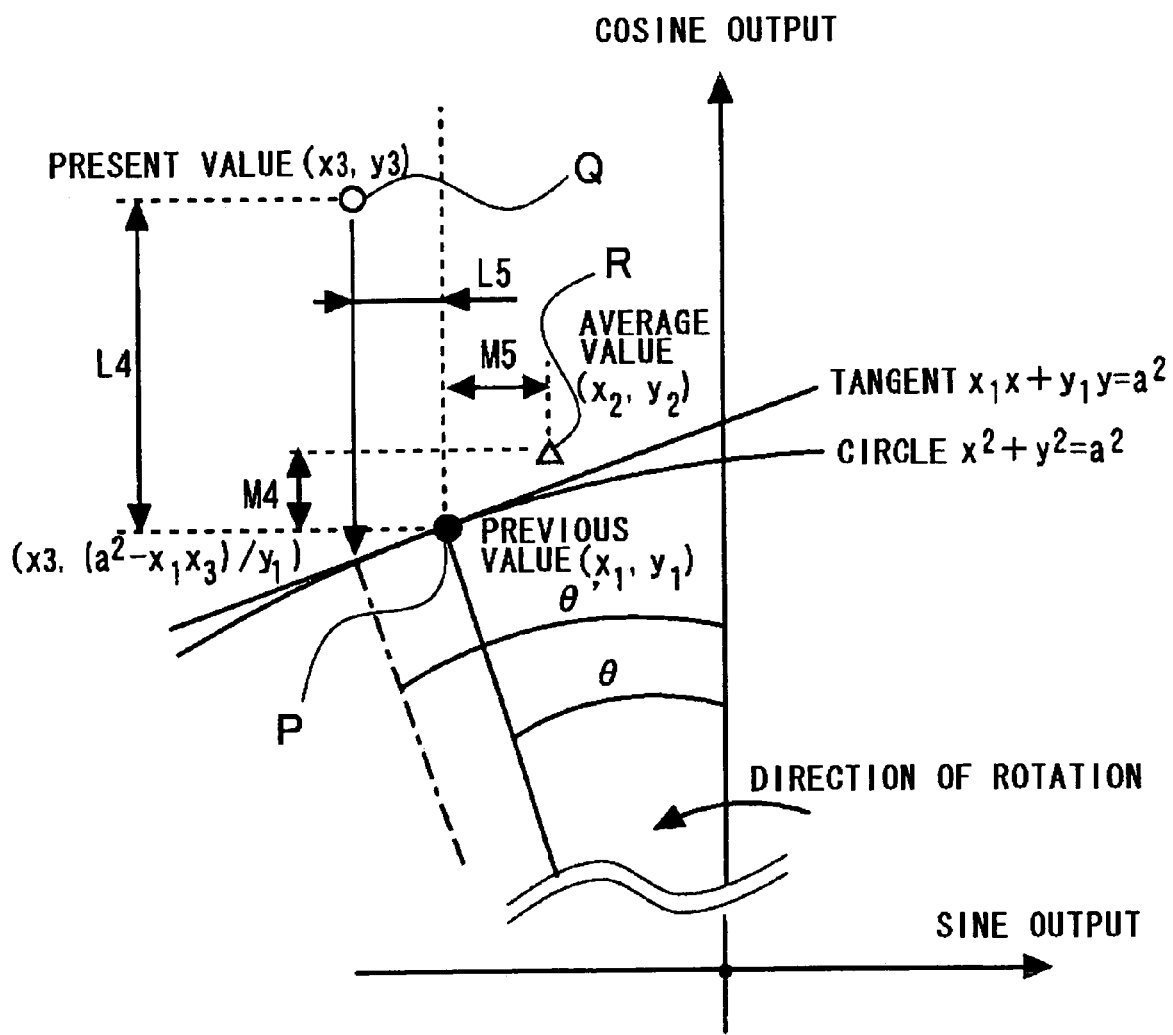
FIG. 10 is a diagram useful in describing a third specific example for obtaining a digital angle of a rotor.

In FIG. 10, let a point P indicated by the black dot represent the previous value, let a point Q indicated by the white dot represent the present value, and let a point R indicated by the triangle represent the average value, these being based upon the results of an A/D conversion obtained by sampling performed a plurality of times. Here it is assumed that the present value along the direction of the sine output axis and the present value along the direction of the cosine output axis exceed the previous values by more than an allowable range.

A correction is required along the directions of both the sine output axis and cosine output axis in this case. In view of the fact that L4>M4, L5<M5 holds, what requires correction are coordinates of the present value along the sine output axis and the coordinates of the average value along the cosine output axis.

In this instance, there are two sets of coordinates corrected by the equation of the tangent. In a case where $x_3$ is substituted into the equation of the tangent and $y_3$ is corrected to $(a^2-x_{13})/y_1$, the coordinates of the correction value become $[x_3,(a^2-x_1x_3)y_1]$. In a case where $y_2$ is substituted into the equation of the tangent, $x_2$ is corrected to $(a^2-y_1y_2)/x_1$ and the coordinates of the correction value become $[(a^2-y_1y_2)/x_1, y_2]$. Of these two sets of coordinates, the set of coordinates near the previous value is adopted as the coordinates of the correction value. In the case of FIG. 10, the coordinates of the correction value become $(a^2-x_1x_3)/y_1$.

If the tangent value at the average value, the tangent value at the present value and the tangent value at the correction value are calculated, the value that is closest to the previous value is the tangent value at the correction value and the digital angle of the rotor can be found from this tangent value.

A calculation method that employs a Fourier transform is described in Patent Document 1 as a method of loading the output of a resolver into an A/D converter and calculating the digital angle. However, a drawback is that since calculation of a square root at least one time becomes necessary, processing by the CPU takes time. In the present invention, the digital angle is calculated by the four arithmetical operations. As a result, the time needed for processing by the CPU is shortened to about 1/15 of the that required in the case where the Fourier transform is applied.

Further, according to Patent Document 1, the excitation power supply, sine output and cosine output are sampled continuously and therefore an A/D conversion having a high speed in proportion to the frequency of the excitation power supply is required. According to the present invention, however, a single sampling only at the peaks of the resolver output suffices.

The method of least squares is known as a technique for performing sampling by an A/D converter and correcting error. If the amount of calculation involved in substitution into the equation of a regression line in the method of least squares and the amount of calculation involved in substitution into the equation of the tangent to a circle in the present invention are compared, it will be understood that since a calculation for finding the equation of the regression line is performed in the method of least squares, 4n+9 (n≧2) of the four arithmetical operations are necessary, whereas the four arithmetical operations need be performed only 18 times (excluding calculation for finding the average value) in the present invention.

Thus, according to the present invention, the number of samplings in the A/D conversion can be reduced and so can the amount of calculation performed by the microcomputer. As a result, the frequency of the excitation power supply can be raised in comparison with the prior art and the number of times digital angle can be calculated per revolution can be increased even at high rotational speeds. Further, since digital angles are calculated without using an R/D converter in a manner similar to that of the prior art, costs can be lowered and space conserved.

Second Embodiment

Figure 11:
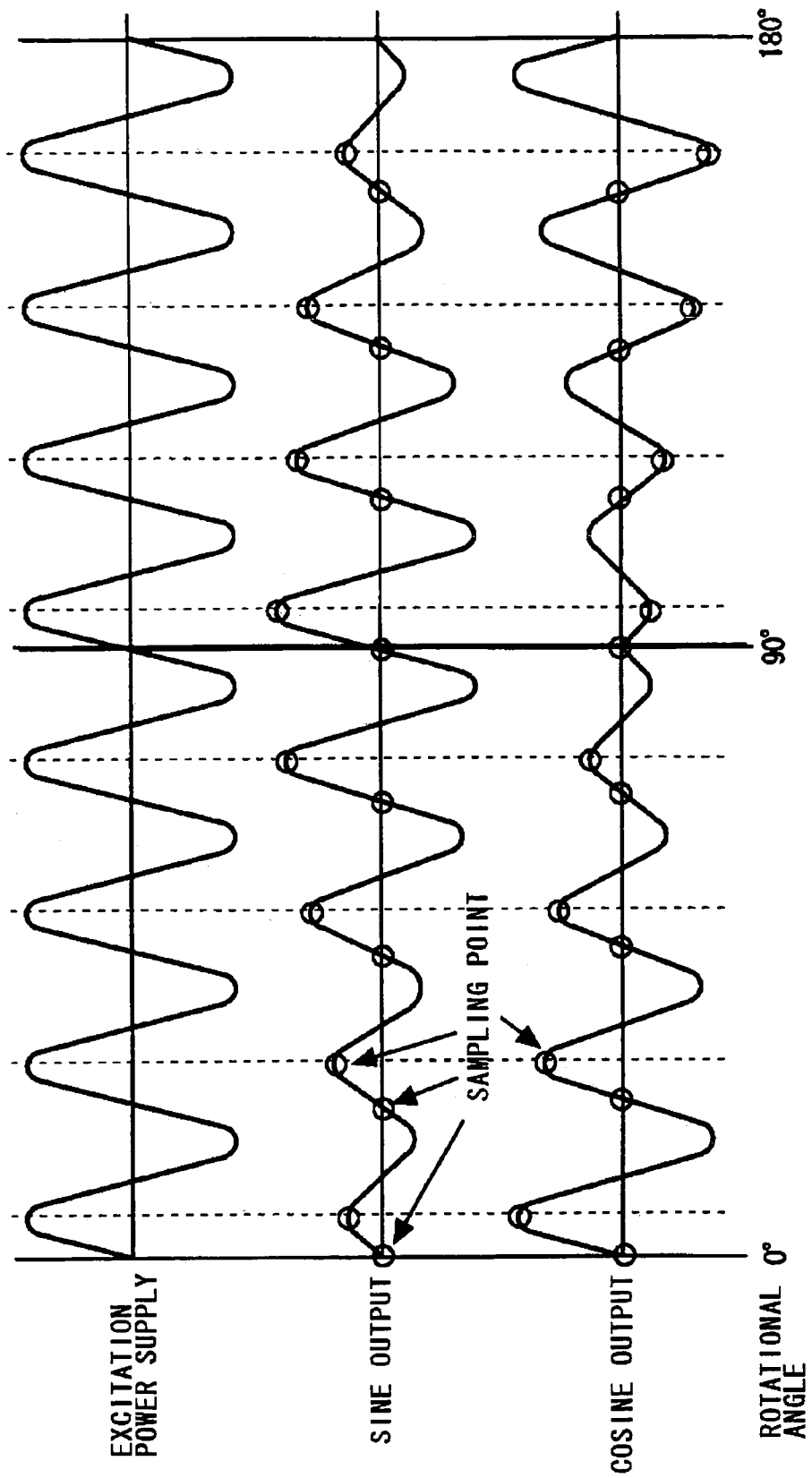
FIG. 11 is a diagram illustrating sampling timings in a resolver-to-digital conversion method according to a second embodiment of the present invention.

In a second embodiment of the present invention, the sine output signal and cosine output signal are sampled not only at the peaks of the excitation power supply but also at the timings of the nodes that immediately precede the peaks, as shown in FIG. 11, by an arrangement the same as that of the first embodiment. If error is not taken into account, the results of the A/D conversion of the sine and cosine output signals sampled at the timings of the nodes will always be constant values. In this case, the result of the A/D conversion of the sine output and the result of the A/D conversion of the cosine output sampled at the timings of the nodes will indicate the value of the center of the circle in FIG. 2.

In a case where the fact that there is no deviation in the value of the center of the circle is confirmed prior to calculation of a digital angle and there is a deviation from the center, the deviation is corrected for with regard to the result of A/D conversion of the sine output and the result of A/D conversion of the cosine output sampled at the timings of the peaks.

Figure 12:
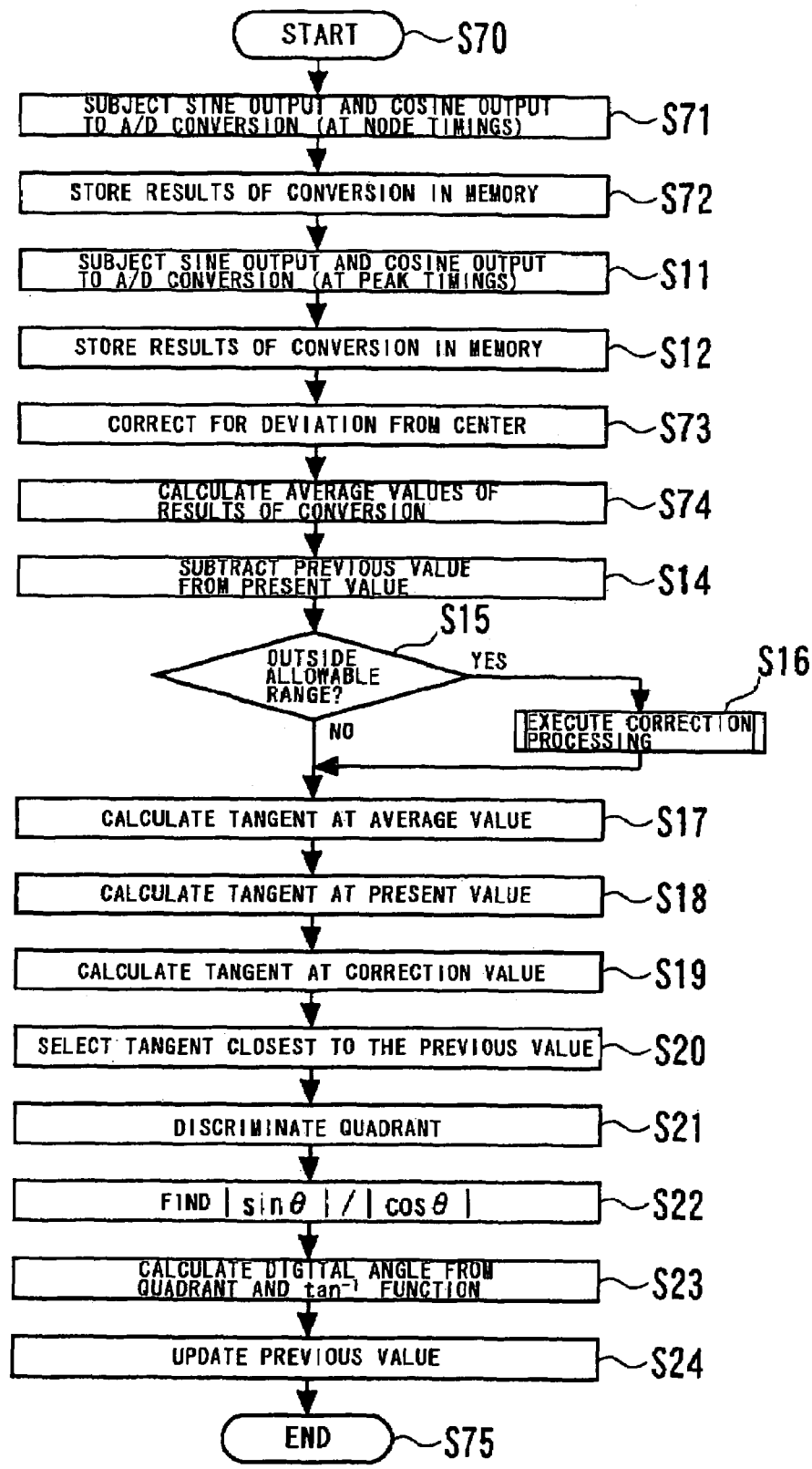
FIG. 12 is a flowchart illustrating the resolver-to-digital conversion method according to the second embodiment of the present invention.
Figure 13:
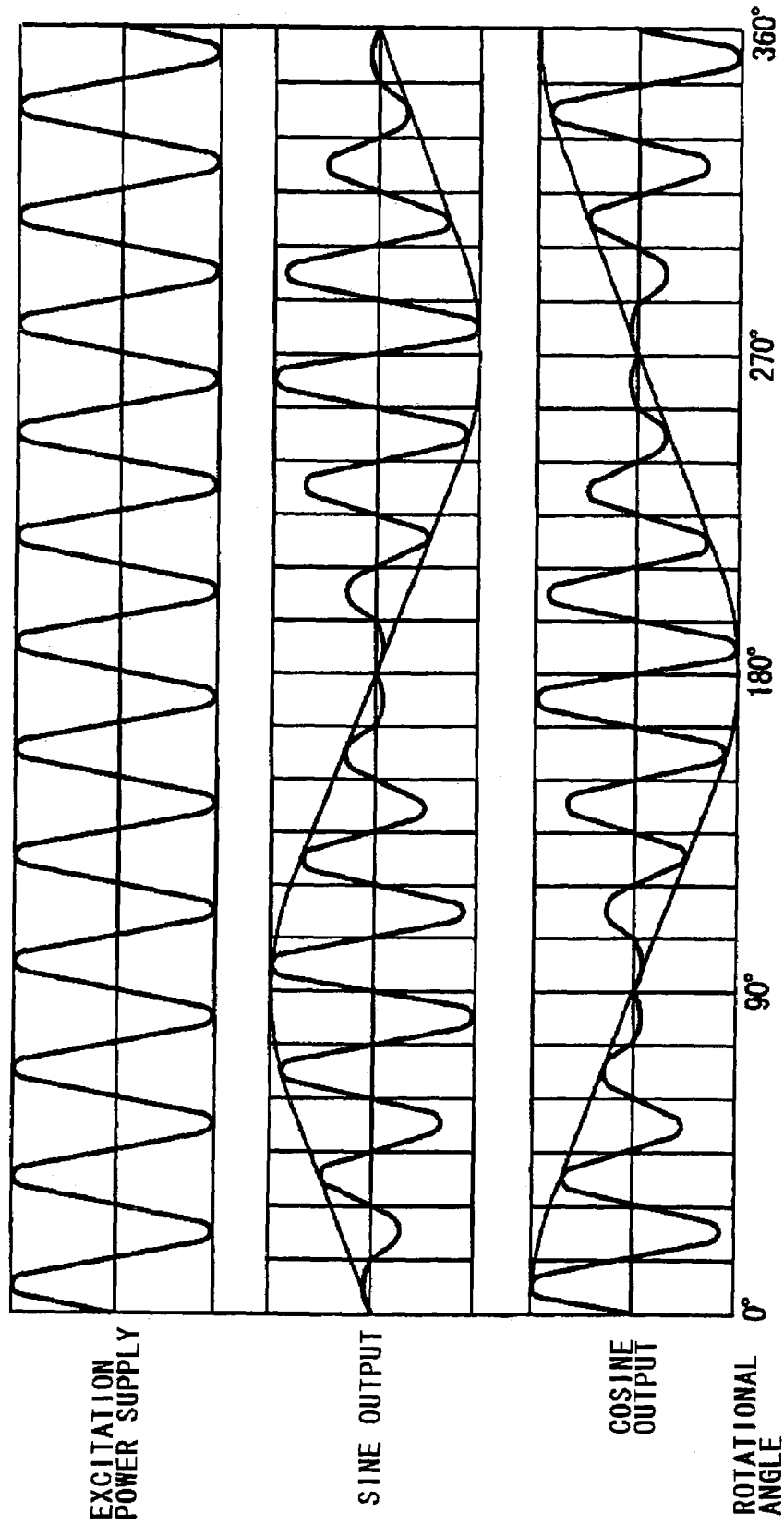
FIG. 13 is a diagram illustrating input/output waveforms of a resolver.
Figure 14:
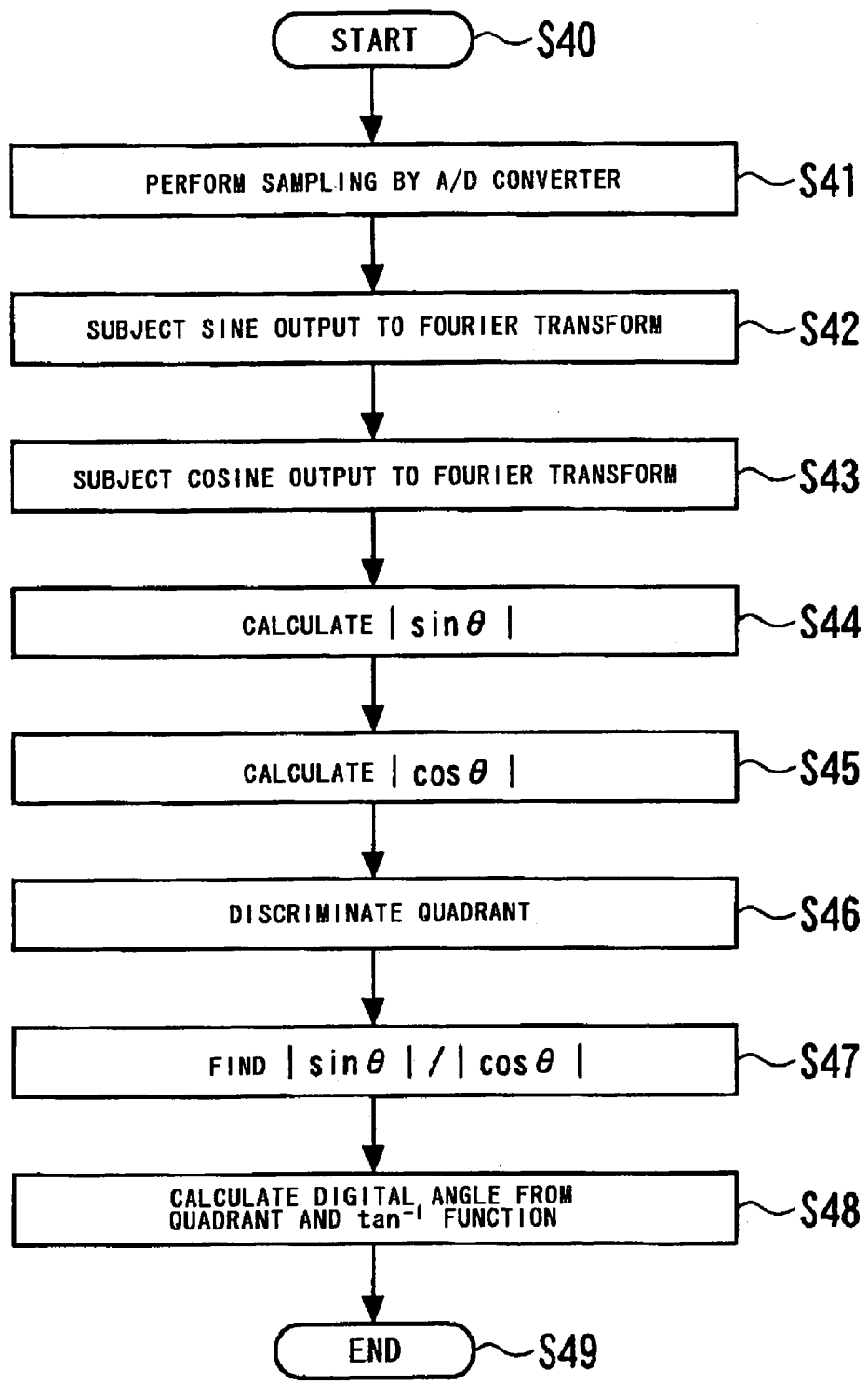
FIG. 14 is a flowchart illustrating a resolver-to-digital conversion method according to Patent Document 1.
Figure 15:
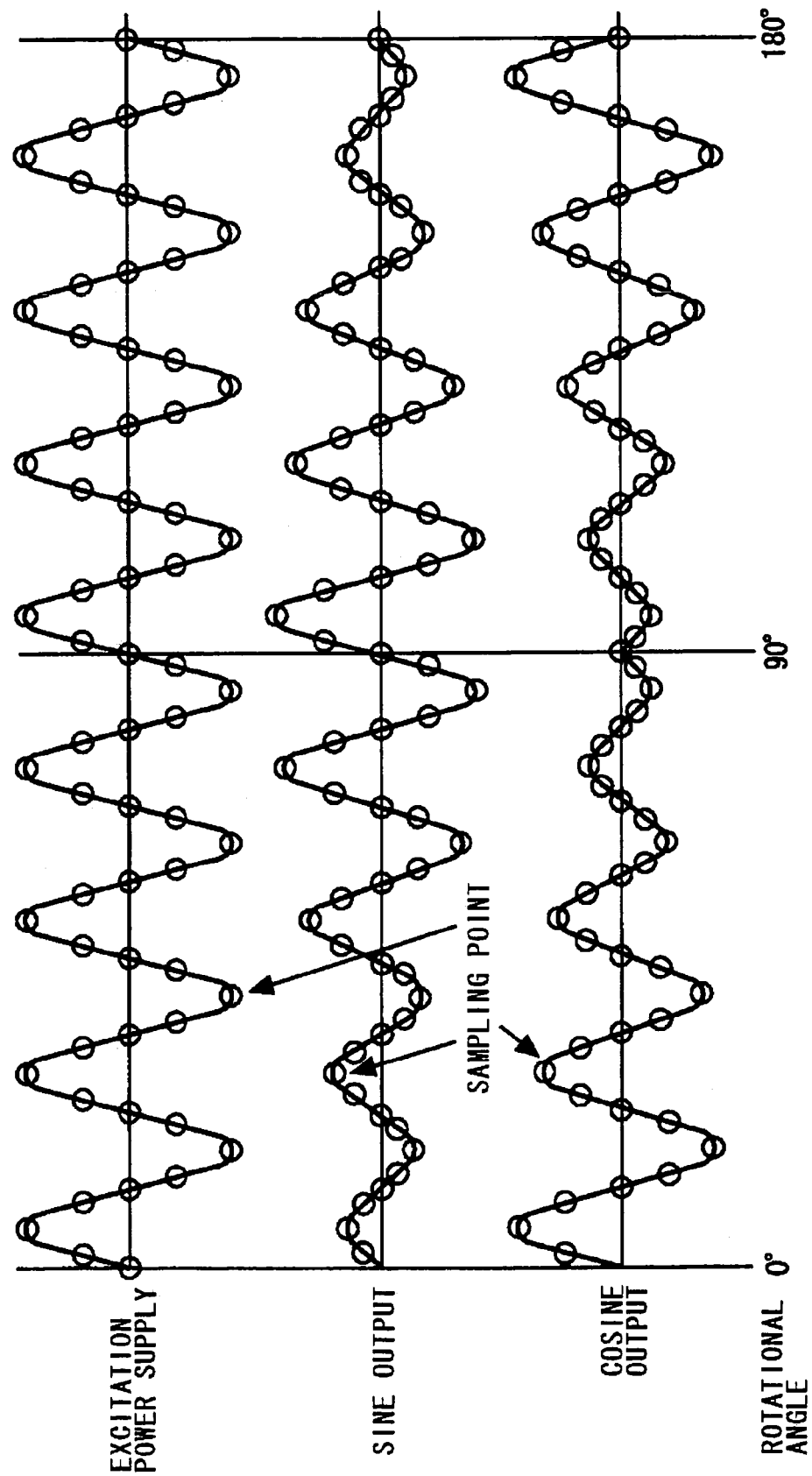
FIG. 15 is a diagram illustrating sampling timings in the resolver-to-digital conversion method according to Patent Document 1.
Figure 16:
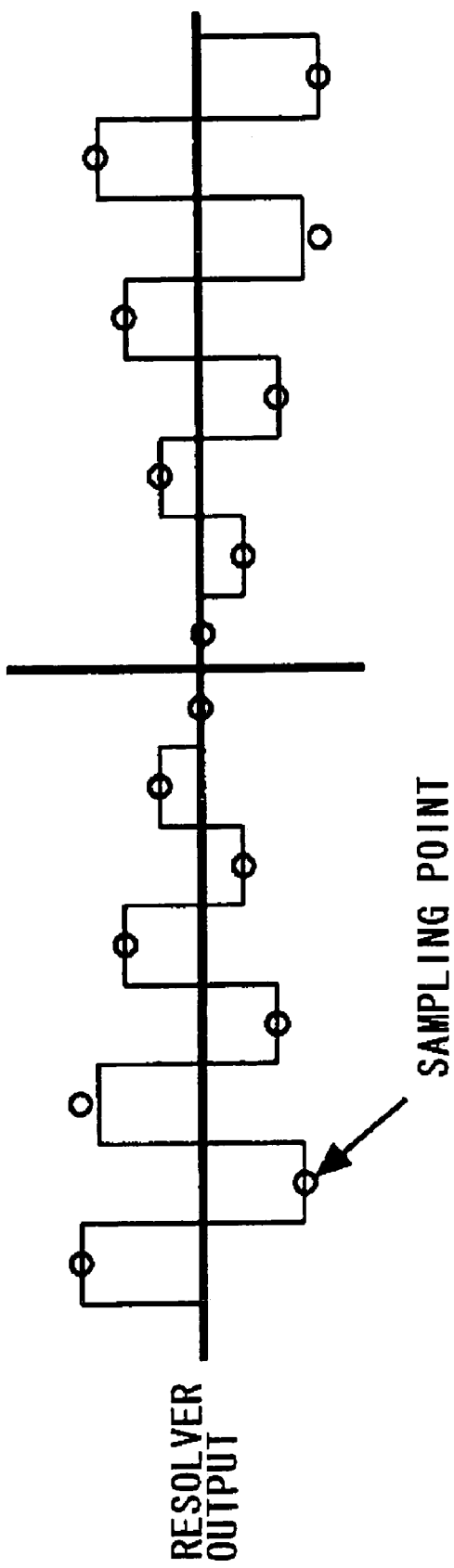
FIG. 16 is a diagram illustrating sampling timings in a resolver-to-digital conversion method according to Patent Document 2.
Figure 17:
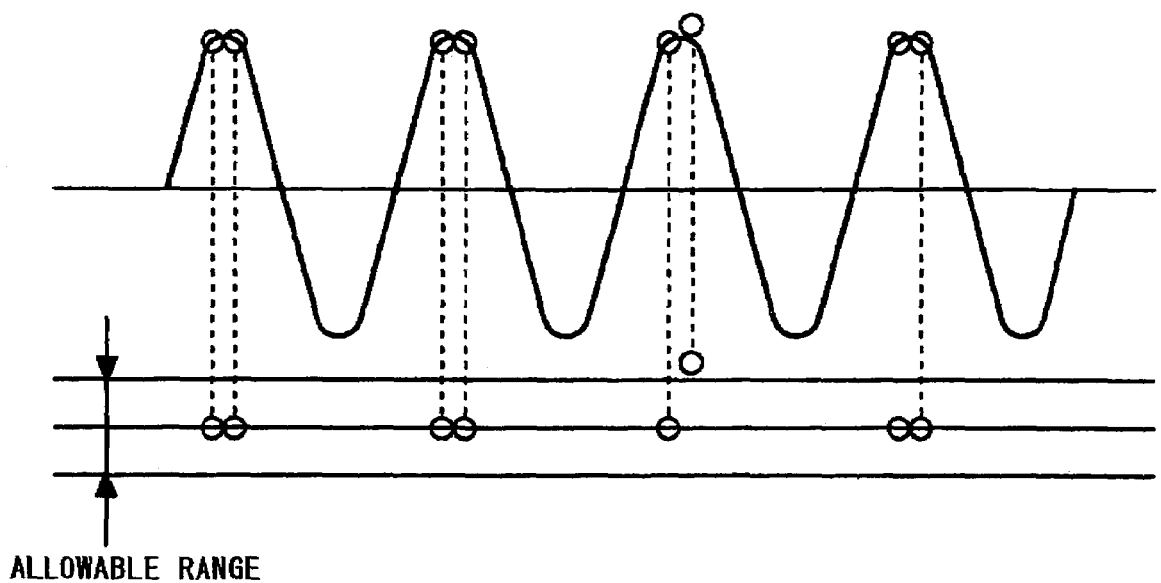
FIG. 17 is a diagram illustrating sampling timings in a resolver-to-digital conversion method according to Patent Document 3.
Figure 18:
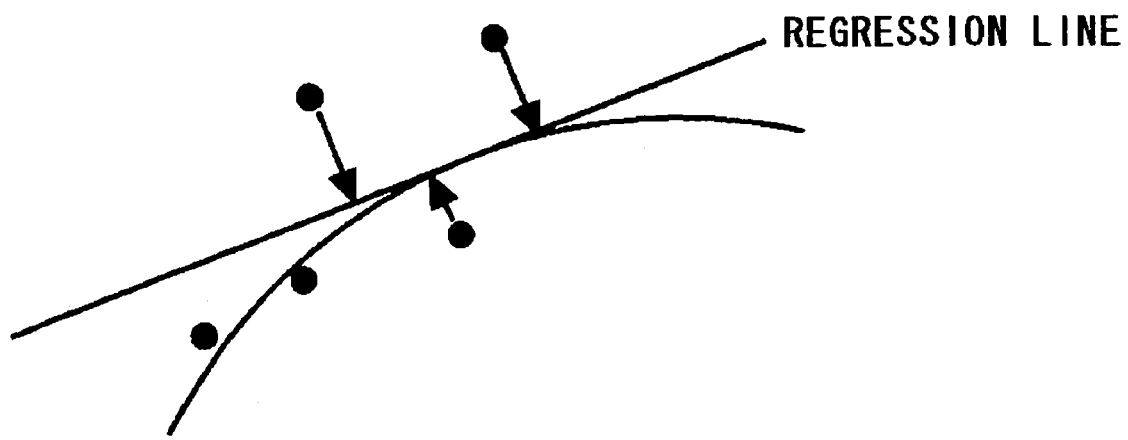
FIG. 18 is a diagram representing a regression line in the method of least squares.
Figure 19:
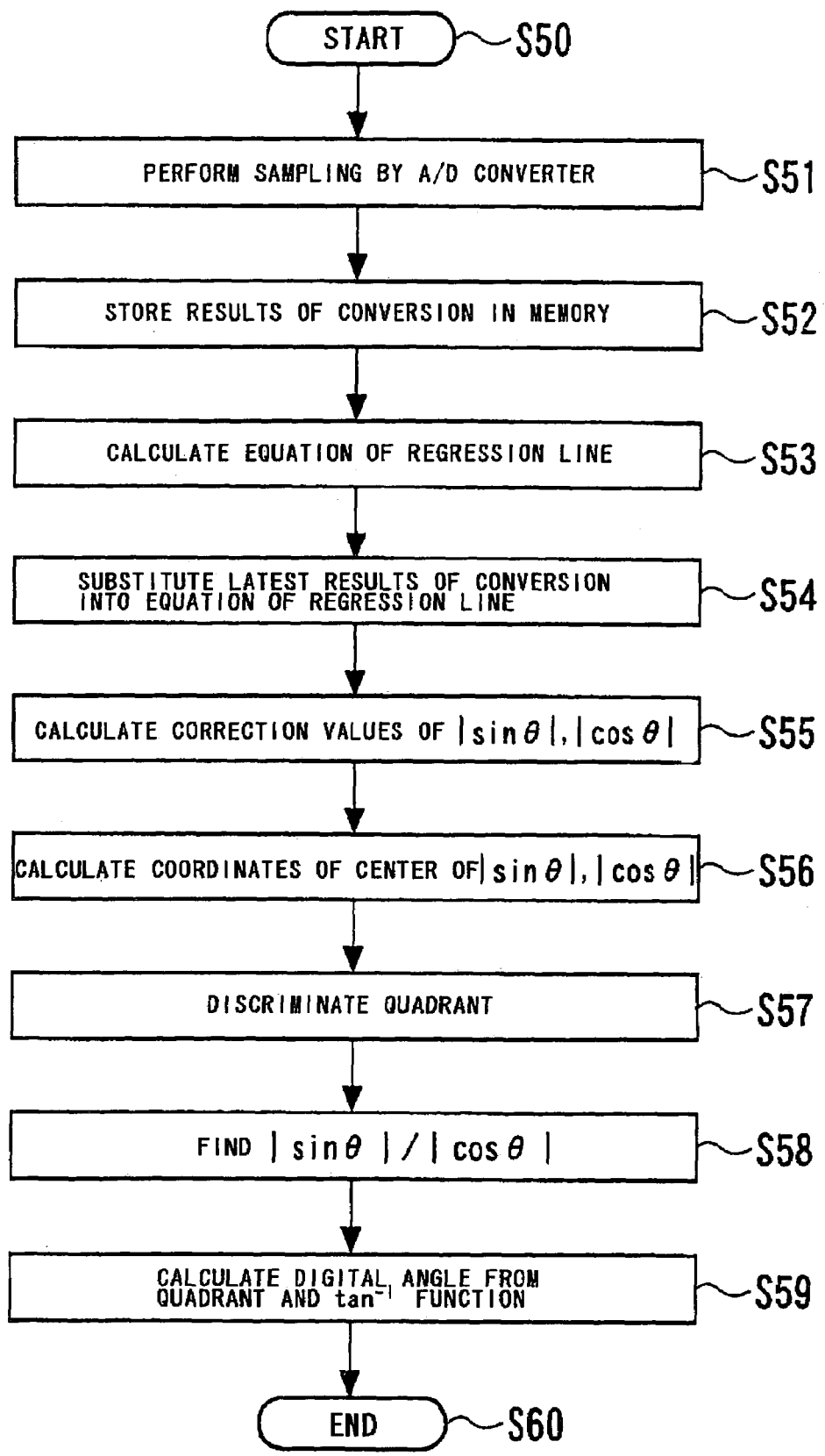
FIG. 19 is a flowchart illustrating a resolver-to-digital conversion method in the method of least squares.

This will be described with regard to a flowchart of the operation performed at this time. FIG. 12 is a flowchart illustrating the resolver-to-digital conversion method according to the second embodiment of the present invention. Processing in FIG. 12 identical with that shown in FIG. 4 is designated by like processing steps and need not be described again.

The sine output and cosine output of the resolver are subjected to an A/D conversion at the timings of he nodes (step S71) and the results of the A/D conversion of each of the signals are stored in memory (step S72).

At step S73, a correction is applied by subtracting the sine output signal sampled at the node timing and stored in memory at step S72 from the sine output signal sampled at the peak timing and stored in memory at step S12, and the difference is adopted as the true result of the A/D conversion. Further, a correction is applied by subtracting the cosine output signal sampled at the node timing and stored in memory at step S72 from the cosine output signal sampled at the peak timing and stored in memory at step S12, and the difference is adopted as the true result of the A/D conversion.

At step S74 an average value is found in a manner identical with that of step S13 from the true result of conversion obtained at step S73.

By virtue of the above operation and sampling of the sine and cosine output signals at the node timming according to the second embodiment, as described above, a deviation from the center of the circle, namely fluctuation of the ground level, is corrected for and the digital angle can be calculated.

Accordingly, the present invention solves the problem of Patent Documents 2 and 3, namely the fact that error cannot be eliminated in a case where the two results of A/D conversion both fluctuate owing to a fluctuation in the ground level of the excitation power supply.

In the field of automotive vehicles, there are many cases where a resolver is mounted on a motor. Even if the ground level of the excitation power supply fluctuates owing to noise produced by the motor, the present invention has the effect of not allowing the fluctuation in the ground level of the excitation power supply to influence the precision of the digital angle.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A resolver-to-digital converting apparatus for calculating a resolver rotational angle from two-phase sampling values that are the result of sampling output signals of two phases, which are obtained from a single-phase-excited, two-phase output resolver, at peak timings of a waveform, comprising:
  a determination unit for determining whether each of the two-phase sampling values has deviated from a prescribed path of rotation by more than a predetermined amount when the two-phase sampling values are represented by orthogonal coordinates;
  a correction processing unit, responsive to a determination by said determination unit that the predetermined amount has been exceeded, for applying a correction to the two-phase sampling values using an equation of a tangent to the path of rotation at a point on the path of rotation at which the previous resolver rotational angle was obtained; and
  an angle calculation unit for obtaining a resolver rotational angle at the corrected two-phase sampling values obtained by said correction processing unit.

2. A resolver-to-digital conversion method for calculating a resolver rotational angle from two-phase sampling values that are the result of sampling output signals of two phases, which are obtained from a single-phase-excited, two-phase output resolver, at peak timings of a waveform, comprising the steps of:
  determining whether each of the two-phase sampling values has deviated from a prescribed path of rotation by more than a predetermined amount when the two-phase sampling values are represented by orthogonal coordinates;
  in response to a determination that the predetermined amount has been exceeded, applying a correction to the two-phase sampling values using an equation of a tangent to the path of rotation at a point on the path of rotation at which the previous resolver rotational angle was obtained;
  obtaining a resolver rotational angle at the corrected two-phase sampling values obtained by correction processing; and
  controlling a motor with the obtained resolver rotational angle.

3. A resolver-to-digital conversion method for calculating a resolver rotational angle from two-phase sampling values that are the result of sampling output signals of two phases, which are obtained from a single-phase-excited, two-phase output resolver, at peak timings of a waveform, comprising the steps of:

obtaining average values of the two-phase sampling values in the past;

determining whether differences between the latest two-phase sampling values, referred to as "present values" hereinafter, and previous two-phase sampling values exceed predetermined tolerance values;

if a determination is made that a tolerance value has been exceeded, obtaining a first distance between the present value and the previous value and a second distance between the average value and the previous value;

adopting the present value as a correction candidate value if the first distance is less than the second distance, and adopting the average value as the correction candidate value if the first distance is equal to or greater than the second distance;

when the previous value is represented by orthogonal coordinates, obtaining a correction value by substituting the correction candidate value into an equation of a tangent that passes through the previous value on a circle that passes through the previous value;

adopting the correction candidate value as the correction value if the distance between the correction value and the previous value is greater than the distance between the correction candidate value and the previous value;

obtaining a first slope at the average value;

obtaining a second slope at the present value;

obtaining a third slope at the correction value; and obtaining a resolver rotational angle from a slope, from among the first, second and third slopes, that is closest to a slope at the previous value; and controlling a motor with the obtained resolver rotational angle.

4. The method according to claim 3, wherein the first distance is a distance obtained by projecting the present value and the previous value onto either of the orthogonal coordinate axes, and the second distance is a distance obtained by projecting the average value and the previous value onto either of the orthogonal coordinate axes.

5. The method according to claim 3, wherein if values that are the result of sampling the output signals of two phases at the timings of nodes of the waveform deviate from the center of the circle by more than a predetermined amount, then the values that are the result of sampling at the peak timings are corrected by the amount of the deviation.

* * * * *